United States Patent
Fuhrman

(10) Patent No.: US 6,433,713 B1
(45) Date of Patent: Aug. 13, 2002

(54) CALIBRATION OF ANALOG-TO-DIGITAL CONVERTERS

(75) Inventor: Philip B. Fuhrman, Wilmington, DE (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/867,580

(22) Filed: May 31, 2001

(51) Int. Cl.[7] .............................. H03M 1/10; H03M 1/50
(52) U.S. Cl. ...................... 341/120; 341/118; 341/168
(58) Field of Search ................................. 341/118, 120, 341/127, 128, 166, 167, 168

(56) References Cited

U.S. PATENT DOCUMENTS

| | | | |
|---|---|---|---|
| 4,357,600 A | 11/1982 | Ressmeyer et al. ......... 340/347 |
| 4,568,913 A | * 2/1986 | Evans ......................... 341/118 |
| 4,574,271 A | * 3/1986 | Yada ........................... 341/118 |
| 4,857,933 A | 8/1989 | Knight ........................ 341/168 |
| 4,947,168 A | 8/1990 | Myers ......................... 341/120 |
| 5,012,247 A | 4/1991 | Dillman ....................... 341/172 |
| 5,101,206 A | * 3/1992 | Riedel ......................... 341/156 |
| 5,117,227 A | 5/1992 | Goeke ......................... 341/166 |
| 5,262,780 A | * 11/1993 | Gray ........................... 341/166 |
| 5,266,951 A | 11/1993 | Kuegler et al. .............. 341/120 |
| 5,321,403 A | * 6/1994 | Eng, Jr. et al. ............. 341/168 |
| 5,361,067 A | 11/1994 | Pinckley ..................... 341/120 |
| 5,448,239 A | 9/1995 | Blumberg et al. ........... 341/166 |
| 5,499,027 A | 3/1996 | Karanicolas et al. ........ 341/120 |
| 5,500,644 A | 3/1996 | Denjean et al. ............. 341/120 |
| 5,592,168 A | 1/1997 | Liao ........................... 341/167 |
| 5,621,406 A | 4/1997 | Goetzinger et al. ......... 341/120 |
| 5,644,308 A | 7/1997 | Kerth et al. ................ 341/120 |
| 5,668,551 A | 9/1997 | Garavan et al. ............. 341/120 |
| 5,745,060 A | 4/1998 | McCartney et al. ........ 341/120 |
| 5,771,012 A | 6/1998 | Shu et al. ................... 341/118 |
| 6,057,891 A | 5/2000 | Guerin et al. ............... 348/572 |
| 6,127,955 A | 10/2000 | Handel et al. .............. 341/120 |
| 6,140,948 A | 10/2000 | Yu ............................. 341/118 |
| 6,166,670 A | 12/2000 | O'Shaughnessy ........... 341/136 |
| 6,198,423 B1 | 3/2001 | Yu ............................. 341/172 |
| 6,243,034 B1 | * 6/2001 | Regier ........................ 341/166 |

OTHER PUBLICATIONS

"Digital Processing in an Analog World," by David Tweed, Mar. 19–23, 2001, pp. 1, 7, and 8.
"Pipeline ADCs Come of Age," www.dbserv.maxim-ic.com, pp. 1–5.
"18–Bit ADC with Serial Interface," Maxim, pp. 6, 7, 13, and 14.

* cited by examiner

Primary Examiner—Howard L. Williams

(57) ABSTRACT

A multislope, continuously integrating analog-to-digital converter can operate in either a conversion mode or a calibration mode. During the calibration mode, a calibration factor is calculated for use during the conversion mode. When applied to the conversion mode, the calibration factor corrects for errors in the conversion process.

20 Claims, 8 Drawing Sheets

CALIBRATION OF ANALOG-TO-DIGITAL CONVERTERS

TECHNICAL FIELD

The present invention relates to the field of calibration. More specifically, the invention relates to calibrating analog-to-digital converters.

BACKGROUND

Conventional analog-to-digital (A/D) converters accumulate errors during conversion of analog signals into digital format. For example, the precision of the components in A/D converters varies, which leads to errors in the conversion process. These errors are typically corrected by calibration. A disadvantage of conventional calibration is the requirement for control logics dedicated to the calibration process, which increases the cost and complexity of conventional A/D converters.

Conventional calibration processes may also utilize a separate calibration standard, such as an externally applied calibration voltage, in order to calibrate an A/D converter. However, calibration results in some converters, such as multislope converters, based on externally applied calibration voltages, do not reflect the errors that actually occur in an A/D converter during the conversion process. Also, in conventional multistage converters, a separate reference is required for each stage of the converter, which leads to further inaccuracies.

Therefore, a need exists for a calibration method for A/D converters that accurately reflects errors that occur during conversion of analog signals into digital format. A need also exists for a calibration method of reduced cost and complexity.

SUMMARY OF INVENTION

The present invention satisfies the above needs and achieves other advantages not present in conventional devices.

According to an aspect of the invention, an A/D converter is operable in either an analog-to-digital conversion mode, or in a calibration mode. In the conversion mode, the A/D converter performs conversion processes during which analog input signals are converted into digital output signals. In the calibration mode, the A/D converter performs a calibration process. During the calibration process, the A/D converter calculates a calibration factor. The calibration factor is used in conversion processes to correct for errors in the conversion processes.

The calibration process includes the steps of performing a plurality of first calibration cycles, and then performing a plurality of second calibration cycles. The plurality of first calibration cycles include the steps of applying a secondary discharge current to an integrator for a first calibration time, and applying a primary discharge current to the integrator for a first discharge time. A first discharge value is determined from the first calibration cycles. The plurality of second calibration cycles also use the primary discharge current and the secondary discharge current, in order to determine a second discharge value. A calibration factor is calculated from the first and second discharge values.

According to the above aspect, the first and second discharge values are a function of the ratio of the primary discharge current to the secondary discharge current. Therefore, an external reference is not required. In addition, it is not necessary to calculate the actual values of the primary and secondary discharge currents, or of the corresponding reference voltages used to generate the primary and secondary discharge currents, because only the ratio between the values is required to calculate the calibration ratio.

As a further advantage, the reference voltages may be the same references used during conversion operations of the A/D converter. Therefore, the calibration result accurately reflects the errors arising during conversion operations of the A/D converter.

Other aspects and advantages of the invention will be discussed with reference to the figures and to the detailed description of the preferred embodiments.

DETAILED DESCRIPTION OF PREFERRED EMBODIMENTS

An analog-to-digital converter and a method of operating an analog-to-digital converter according to the present invention will be described below by way of preferred embodiments and with reference to the accompanying drawings.

Figure 1:
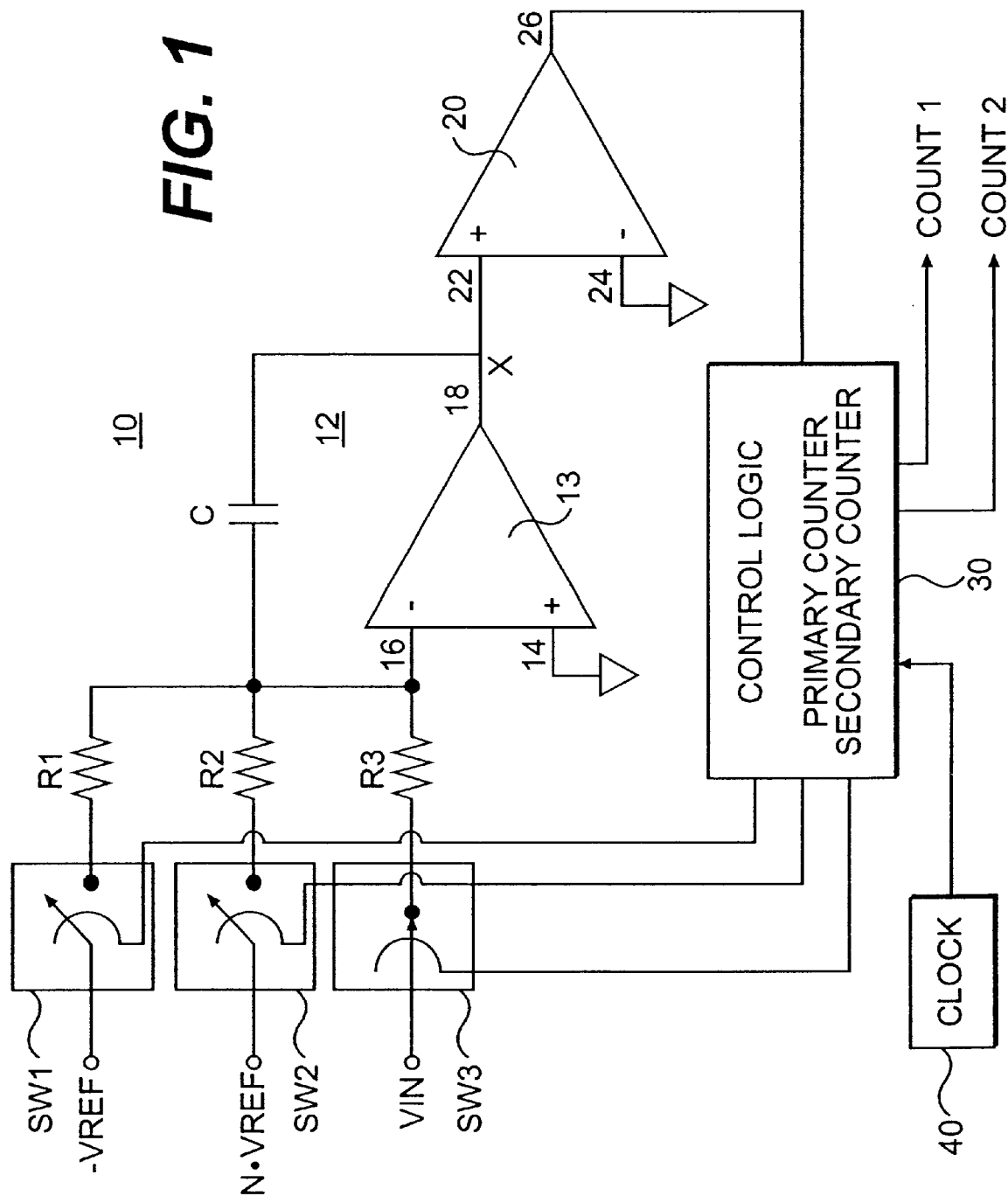
FIG. 1 is a schematic diagram of an analog-to-digital convert according to an embodiment of the present invention.

FIG. 1 illustrates an analog-to-digital (A/D) converter 10 according to an embodiment of the present invention. The AID converter 10 is a continuously integrating, multislope A/D converter. The A/ID converter 10 includes an integrator 12 which is comprised of an operational amplifier 13 and an integration capacitor C. The operational amplifier 13 has a non-inverting input 14, an inverting input 16, and an output 18. The inverting input 16 is coupled to a small reference voltage $-VREF$ through a resistor R1 and a switch SW1, and coupled to a large reference voltage $N \cdot VREF$ through a resistor R2 and a switch SW2. The input voltage VIN is coupled to the input 16 through a resistor R3 and a switch SW3. The non-inverting input 14 is coupled to ground, and the output 18 is coupled to a non-inverting input 22 of a comparator 20. An inverting input 24 of the comparator 20 is coupled to ground, and an output 26 of the comparator 20 is coupled to a control logic 30.

The control logic 30 is coupled to the switches SW1, SW2, SW3, and controls the opening and closing of the switches SW1, SW2, SW3. A clock 40 is coupled to the control logic 30 to provide a time base to the control logic 30.

The control logic 30 includes primary and secondary counters. The outputs of the primary and secondary counters are coupled to a processor (not illustrated) of the A/D converter 10. The processor may be, for example, a central processing unit, a microprocessor, or other processing unit. The processor uses the count 1 and count 2 values for A/D conversion of the input voltage VIN, and to perform calibration functions for the A/D converter 10.

Figure 2:
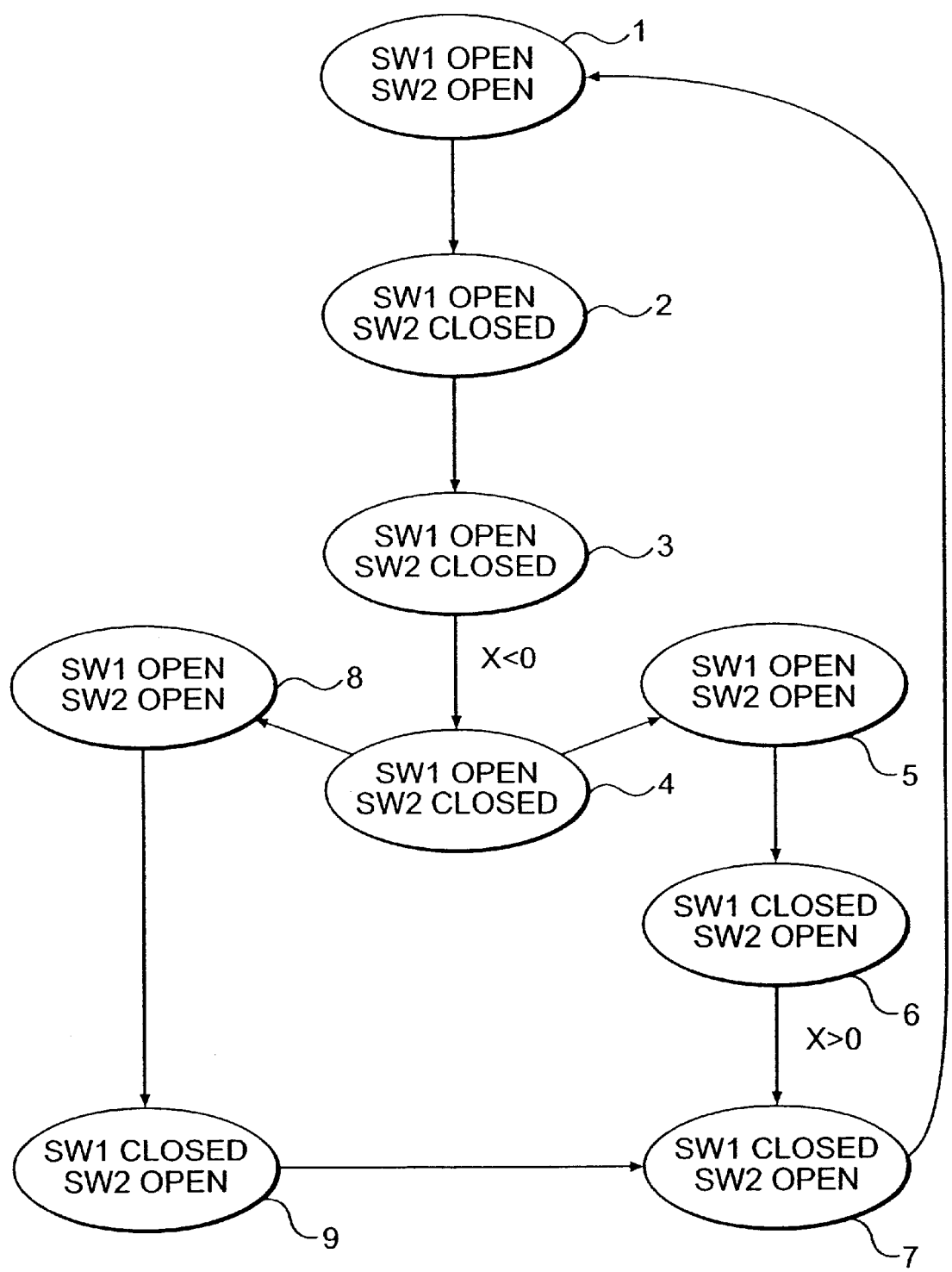
FIG. 2 is a state diagram for the A/D converter of FIG. 1.

The A/D converter 10 is operable in two modes: a conversion mode and a calibration mode. FIG. 2 illustrates a state diagram for the A/D converter 10 for both the conversion mode and the calibration mode. In the conversion mode, the A/D converter 10 converts an unknown analog input signal VIN into a digital output signal. In the calibration mode, the A/D converter 10 determines a calibration factor α to be applied during the conversion process to correct for errors in the conversion process. The conversion process and the calibration process are synchronous, and both processes repeat over a fixed number of counts. In the exemplary embodiments discussed below, the conversion process and the calibration process repeat over a cycle of 2048 counts, although greater or fewer counts can be used.

As illustrated by the state diagram, the conversion mode and the calibration mode of operating the A/D converter 10 are similar, and the two modes can be carried out using similar logic. In a conversion cycle, the A/D converter 10 proceeds through states 1–7, and returns to state 1 to begin a new conversion cycle. In a calibration cycle, the A/D converter 10 proceeds through states 1–4, 8, 9, 7, and returns to state 1 to begin a new calibration cycle.

The conversion process may be performed during specified periods. During these periods, the A/D converter 10 performs its primary function of converting analog signals into digital signals over a series of conversion cycles. The A/D converter 10 can be programmed to operate in the calibration mode for selected intervals between periods of conversion. In the calibration mode, the A/D converter 10 executes a number of calibration cycles, and generates the calibration factor α. After the calibration process is complete, the A/D converter 10 reverts to the conversion mode. In the conversion mode, the A/D converter 10 utilizes the calibration factor α from the calibration process to correct for errors in the conversion process. The conversion mode and the calibration mode are each discussed in detail below.

Figure 3:
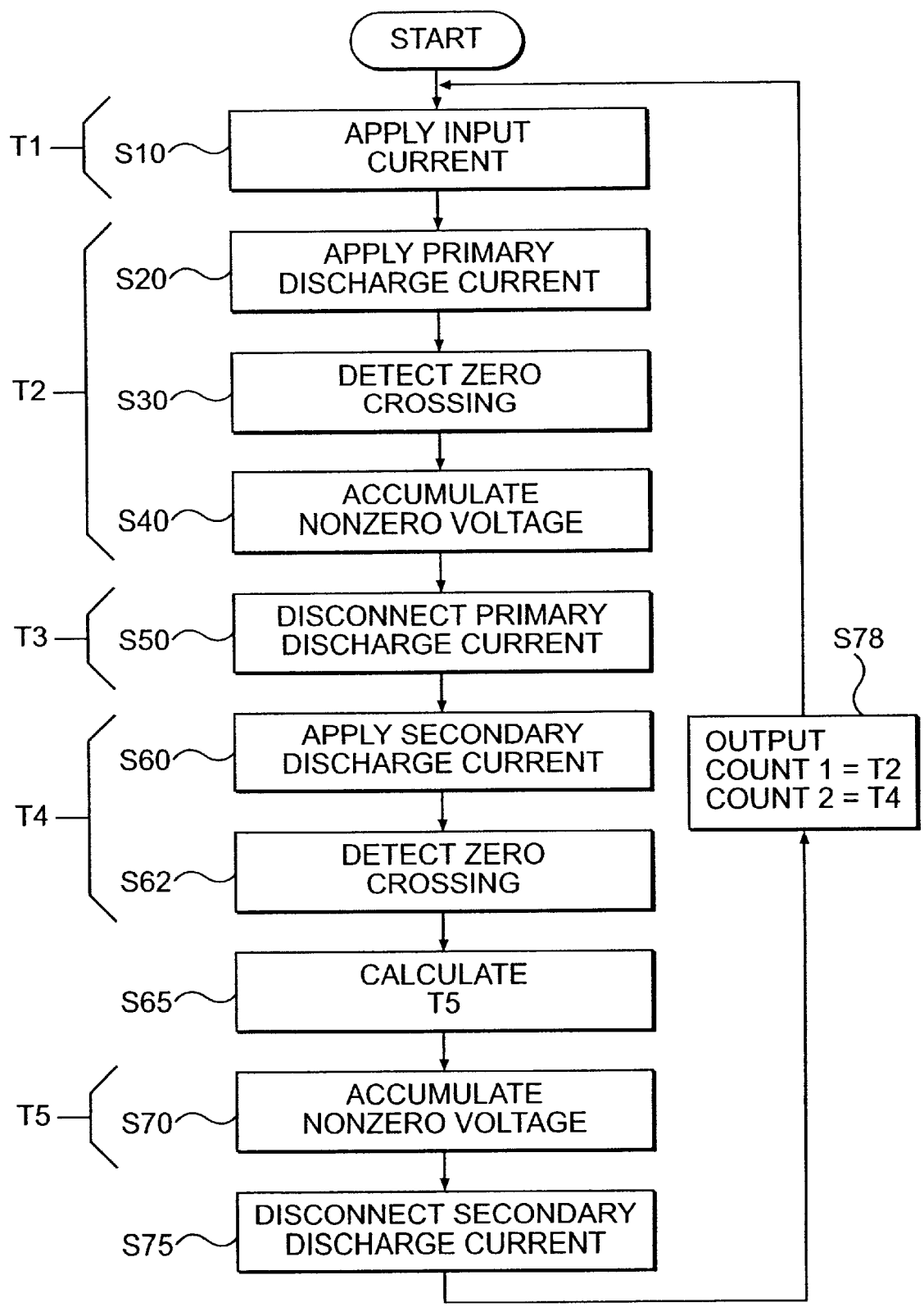
FIG. 3 illustrates a method of operating the A/D converter of FIG. 1 in a conversion mode.
Figure 4:
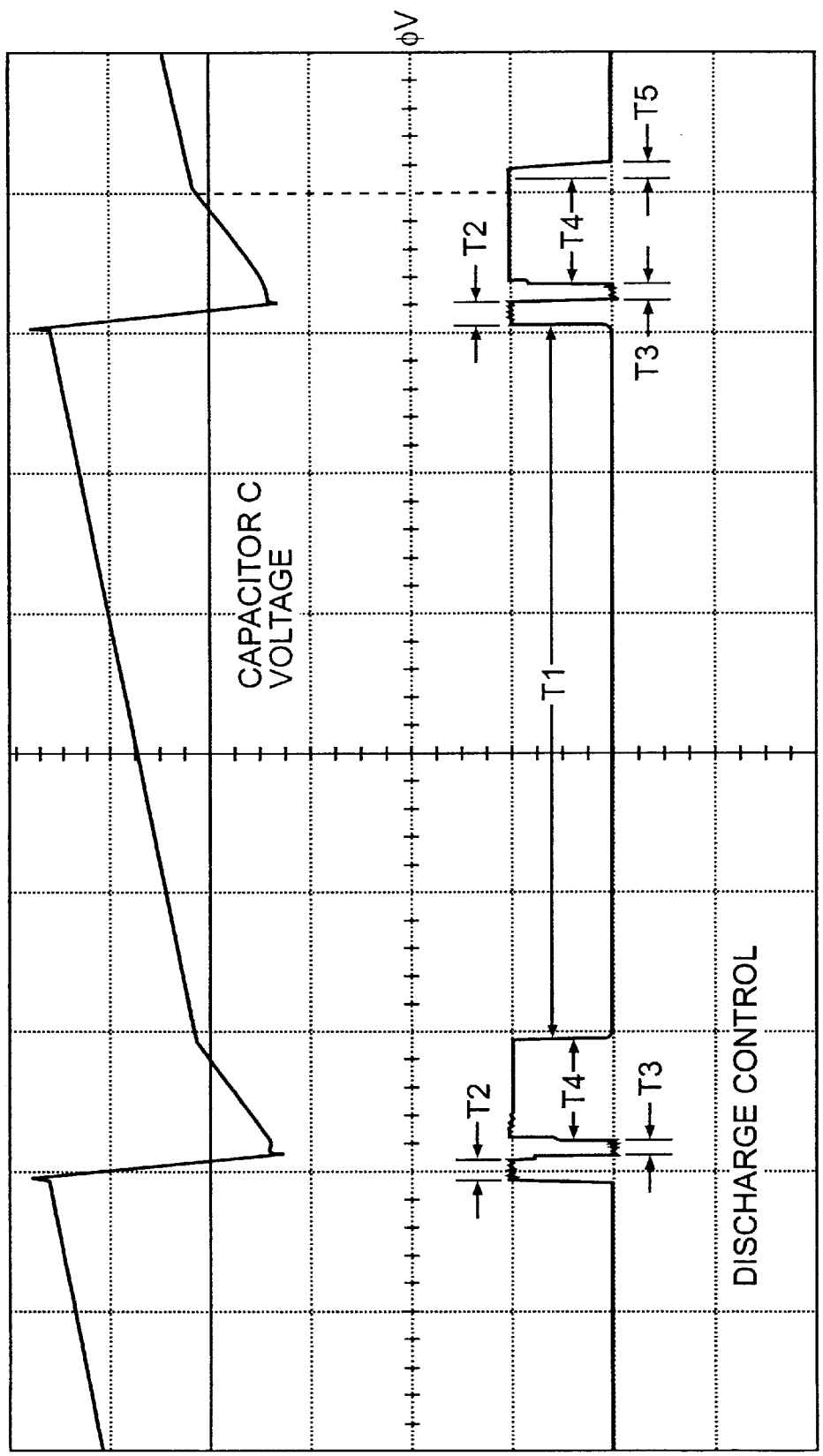
FIG. 4 illustrates voltage on an integration capacitor and a discharge control in the conversion mode.

The conversion mode of the A/D converter 10 will now be discussed with reference to FIGS. 2–4. FIG. 3 is a flow chart illustrating a method of operating the A/D converter 10 in the conversion mode. FIG. 4 illustrates voltage on the integration capacitor C, and a discharge control, during the conversion process. The conversion process comprises a series of conversion cycles, each conversion cycle being represented by the closed conversion loop in FIG. 2 (states 1–7, 1). Each conversion cycle can last, for example, for 2048 counts.

Referring to FIGS. 2–4, the conversion process begins at step S10 by closing the switch SW3, which results in the application of an input current VIN/R3 to the integrator 12. The controller 30 maintains the application of the input current VIN/R3 throughout the conversion process. Step S10 begins state 1. In state 1, the switches SW1 and SW2 are open, and no reference currents are applied to the integrator 12. The A/D converter 10 is maintained in state 1 for a time T1, during which time the charge on the integration capacitor C increases due to the application of the input current VIN/R3. The increase in voltage on the integration capacitor C over time T1 is illustrated by FIG. 4.

In step S20, the switch SW2 is closed, and a primary discharge current N·VREF/R2 is applied to the inverting input 16 for a time T2. Time T2 is the primary discharge period for the integrator 12, and states 2–4 all occur during time T2. During time T2, the switch SW3 remains closed, and the combination of the input current VIN/R3 and the primary discharge current N·VREF/R2 discharges the integration capacitor C through ground. FIG. 4 illustrates the drop in voltage on the integration capacitor C during T2.

The magnitude of the charge of the integration capacitor C decreases until an output signal X (see FIG. 1) from the operational amplifier 13 crosses zero, as detected by the comparator 20 in step S30. The zero crossing of the signal X indicates zero voltage on the integration capacitor C, and corresponds to state 3.

After the signal X crosses zero, the SW2 remains closed, and a nonzero voltage accumulates on the integration capacitor C in step S40. The accumulation of charge on the integration capacitor C corresponds to state 4, which occurs at the end of the primary discharge period T2. The switch SW2 is maintained closed for a small, fixed time after the zero crossing, which may be on the order of, for example, 1–5% of the total conversion cycle time. The primary counter 30 determines time T2 as count 1 in FIG. 1. The time T2 is the amount of time elapsed between step S20 and S30, plus the fixed time amount of time that the primary discharge current is applied after the zero crossing.

In step S50, the control logic 30 opens the switch SW2 for a time T3, disconnecting the primary discharge current from the integrator 12. The switch SW3 remains closed. The time T3, during which time the A/D converter 10 is in state 5, allows transients arising from current switching to die away. The time T3 may be a relatively short time, on the order of, for example, 5% of the total conversion cycle time.

In step S60, the switch SW1 is closed for a time period of T4+T5, while a secondary discharge current −VREF/R1 is applied to the integrator 12 through the resistor R1. The time T4+T5 corresponds to the secondary discharge period, or states 6 and 7. During the secondary discharge period, a secondary discharge current of −VREF/R1 is applied to the integrator 12. The integrator 12 is discharged more slowly in the secondary discharge period than in the primary discharge period, because the secondary discharge current is smaller than the primary discharge current. For example, if N=4, the primary discharge current would be 4·VREF/R2. The resistance of R2 can be selected so that it is smaller than R1, for example, by a factor of 4. Therefore, in this example, the primary discharge current would be 16 times as great in magnitude as the secondary discharge current. The ratio of primary to secondary discharge current can be referred to generally as λ.

The A/D converter 10 remains in state 6 until the comparator 20 detects a zero crossing of signal X in step S62. T4 is the time required for the integration capacitor C charge to cross zero after applying the secondary discharge current. The secondary counter determines time T4 as count 2. Because the secondary discharge rate is approximately $\frac{1}{16}^{th}$ of the primary discharge rate, the voltage change per count of the secondary counter is of approximately 16 times finer resolution than the primary counter during the primary discharge period.

In step S65, the processor calculates a time T5. After the zero crossing, in step S70, the switch SW1 remains closed for the time T5, and a nonzero voltage accumulates on the integration capacitor C during the time T5. The time T5 corresponds to state 7. State 7 serves the dual purpose of allowing a nonzero voltage to accumulate on the integration capacitor C after the zero crossing, and of providing a window to apply a correction time to the conversion process. The time T5 includes a fixed time period m, and a variable correction time Δ.

The correction time Δ is advantageous because errors in the VIN measurement may be introduced by mismatches in the primary and secondary discharge currents. Ideally, the discharge currents have a constant ratio of λ=−N·R2/R1. In the exemplary embodiment discussed above, the ideal constant ratio λ=−16. Errors arise from mismatches in the discharge currents that occur due to the limits of resolution of the resistors R1, R2, and other components in the A/D converter 10. Because the A/D processor assumes the ideal ratio λ when making the conversion calculation for VIN, failure to correct for errors during conversion can result in periodic nonlinearities in the conversion process. According to the present invention, mismatches in the primary and secondary discharge currents are compensated for by adding the variable correction time Δ to the fixed time m. The correction time Δ is calculated using the calibration factor α calculated in the calibration process. The calculation of the calibration factor α will be discussed later with reference to FIGS. 5 and 6. The application of the correction time Δ to the conversion process in order to calculate T5 is discussed below.

After the comparator 20 detects a zero crossing of the signal X at state 6, the integration capacitor C continues to discharge in state 7. The time that the A/D converter remains in state 7 is:

$$T5 = m + \Delta.$$

The correction time Δ can be positive or negative. The value m is a nonzero value chosen to be greater than Δ, ensuring that T5 is positive. The correction time Δ is calculated according to the following general formula:

$$\Delta = T4 \cdot \alpha.$$

The calculation of T5 is performed for each conversion cycle.

The calculation of the correction time Δ may be based on the immediately preceding time T4, or, it may be based on an average of T4 values from a selected number of previous conversion cycles. In the latter case, the correction time would be calculated as:

$$\Delta = T4_{avg} \cdot \alpha.$$

When using an average T4 value, the correction time Δ lags in the conversion process by one or more cycles.

If the correction time Δ includes a fractional value of a clock cycle, the fractional values can be carried over into a subsequent conversion cycles using first order sigma-delta modulation or second order sigma-delta modulation.

The counts 1 (T2) and 2 (T4) measured during the primary and secondary discharge periods are output to the processor in step S78. The counts 1 and 2 are used to convert VIN into digital format in the processor. VIN is calculated by combining the times T2 and T4, each time being weighted by the amplitude of its discharge current. In weighting T2 and T4, T4 is divided by the ideal ratio λ, or, T2 is multiplied by ideal ratio λ. The processor also applies post-conversion digital filtering, and other post-conversion signal processing.

According to the above-described conversion process, the overall resolution of the A/D converter 10 is determined by the smaller, secondary discharge current −VREF/R2, which meters smaller quanta of charge in the integrator 12. The dynamic range of the A/D converter 10 is determined by the larger, primary discharge current N·VREF/R1, which determines the maximum negative voltage that can be applied to the A/D converter while maintaining linear behavior of the integrator 12. The A/D converter 10 therefore achieves high resolution conversion of VIN, over a wide dynamic range, with low noise.

The above embodiment is described in the context of an ideal ratio of λ=−16. Other ratios, however, may achieve similar advantages. When choosing an ideal ratio λ, it is preferable to use a binary number because the conversion operation can use binary shifts when multiplying by λ.

The above-described embodiment discloses reference voltages −VREF and N·VREF of opposite polarity. This feature provides flexibility to the control of the A/D converter 10 because the reference signals of opposite polarity can be used to balance the input signal VIN on either side of ground. Reference signals of opposite polarity also allow for continuous measurement of integration capacitor C charge from one side of ground, across ground, to the other side of ground. The A/D converter 10 therefore does not change its measurement characteristics in the vicinity of ground.

Figure 5:
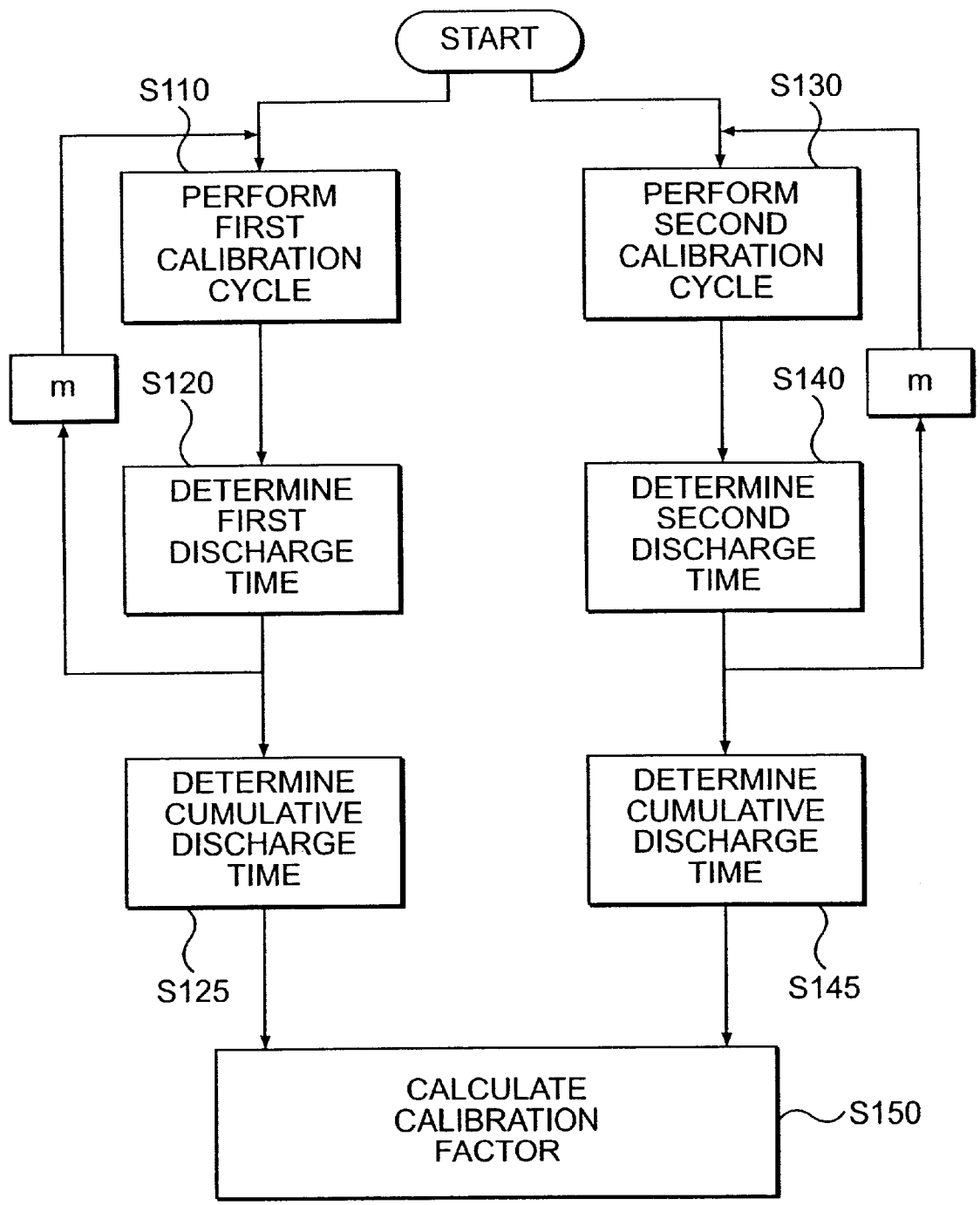
FIG. 5 illustrates a method of operating the A/D converter in a calibration mode.
Figure 6:
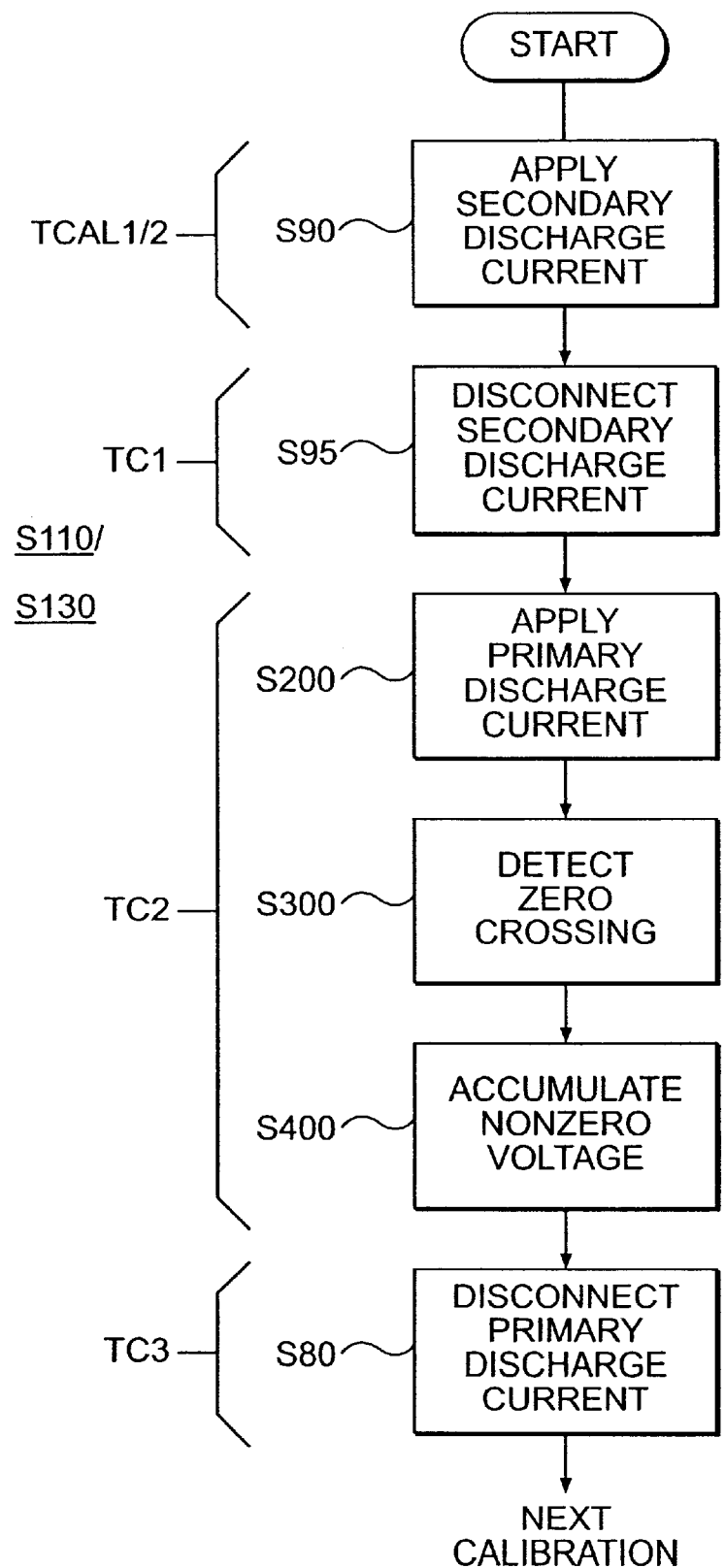
FIG. 6 illustrates a method of operating the A/D converter in a first and a second calibration cycle.
Figure 7:
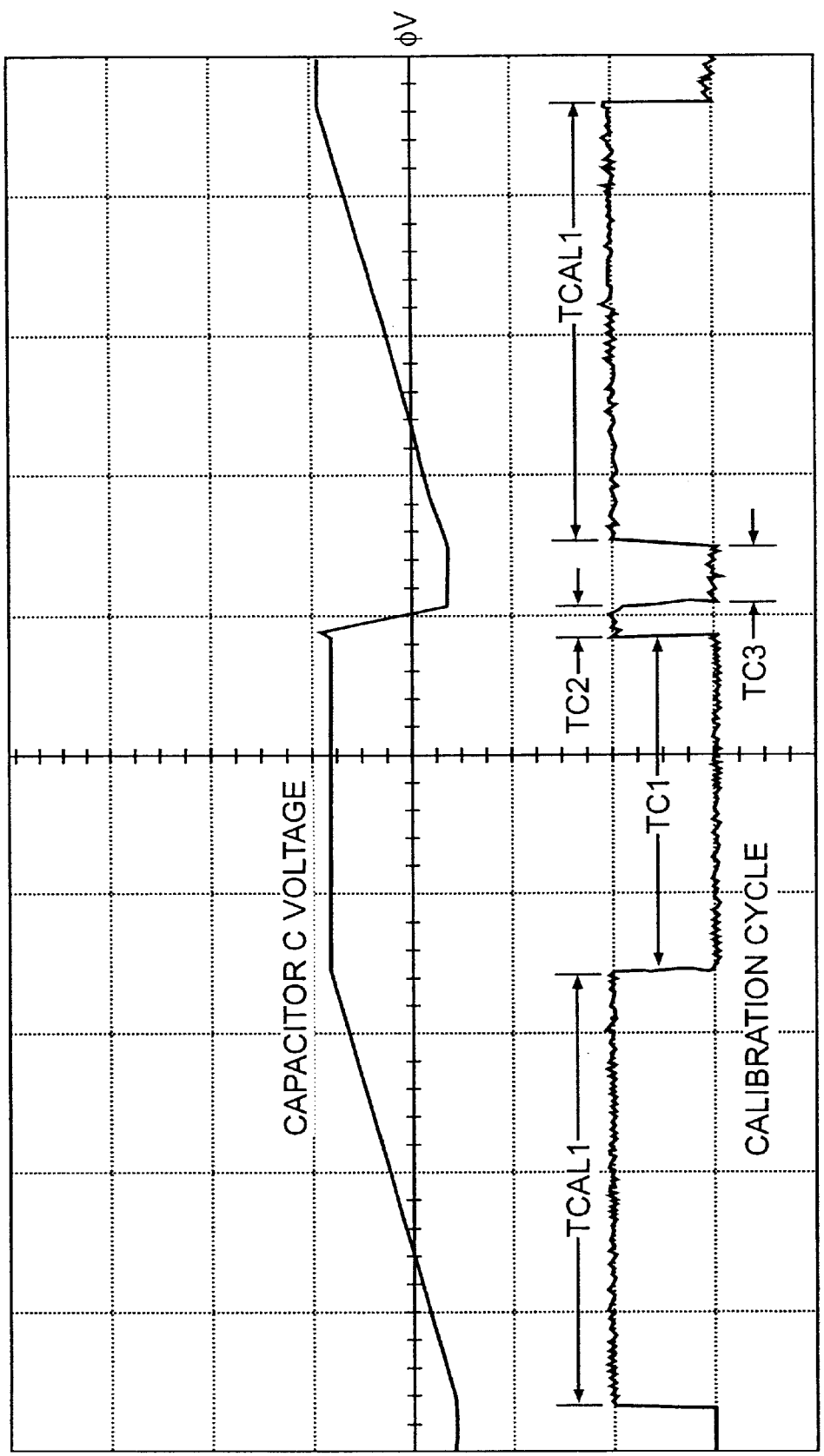
FIG. 7 illustrates voltage on an integration capacitor and a discharge control in the first calibration cycle.
Figure 8:
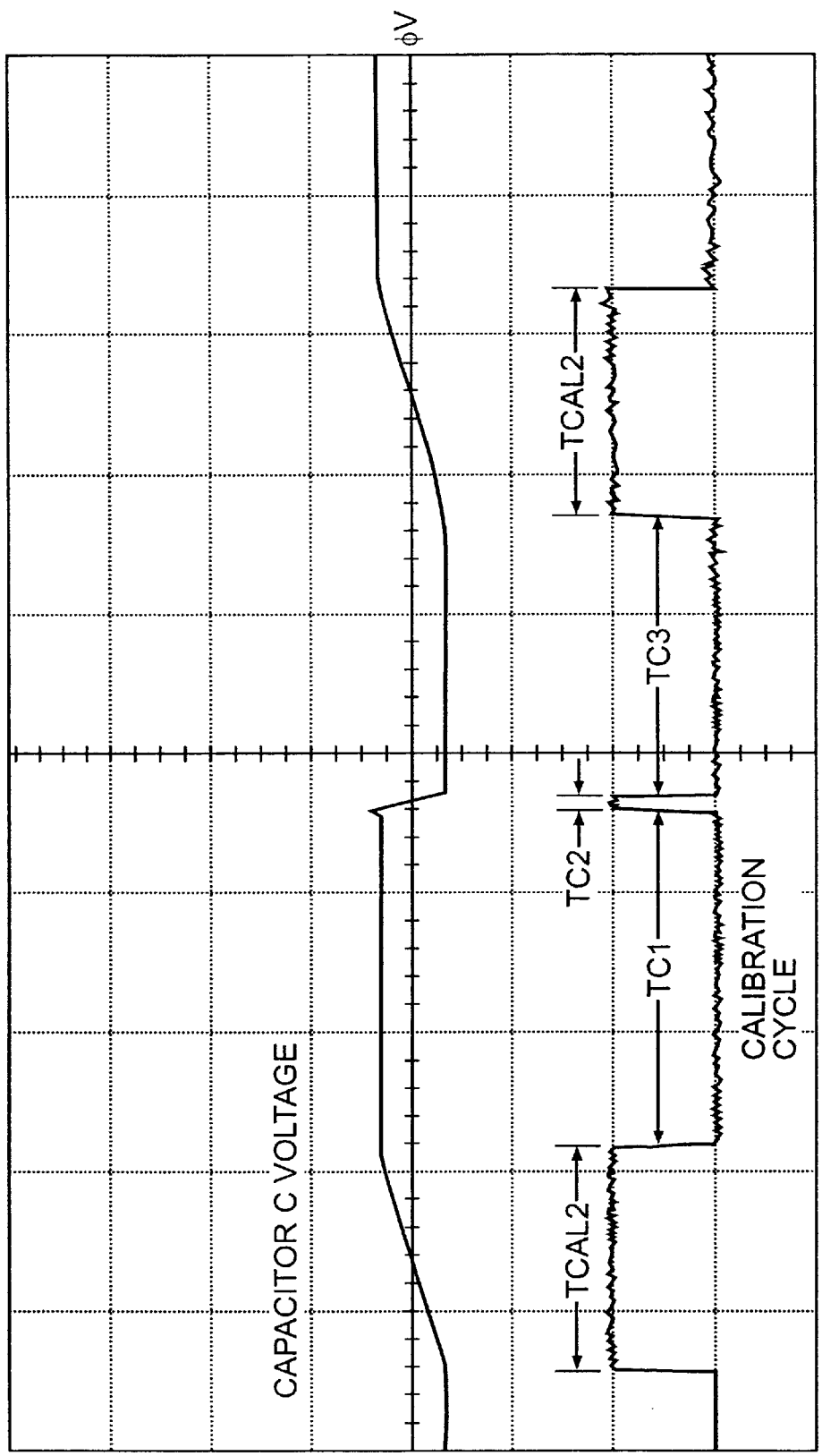
FIG. 8 illustrates voltage on an integration capacitor and a discharge control in the second calibration cycle.

The calibration factor α used in the conversion mode is calculated during a calibration process while the A/D converter 10 is in the calibration mode. The calibration mode of the A/D converter 10 will now be discussed with reference to FIGS. 2 and 5–8. FIG. 5 illustrates a method of operating the A/D converter 10 in the calibration mode. FIG. 6 illustrates the first and second calibration cycles of the calibration process. FIG. 7 illustrates voltage on the integration capacitor C during the first calibration cycle, and FIG. 8 illustrates voltage on the integration capacitor C during the second calibration cycle.

Calibration processes can be performed, for example, at predetermined intervals between conversion processes. Calibration can be performed more frequently if a higher degree of accuracy is desired for conversion processes, or in response to a change in environment, such as a change in temperature, or with increasing age of components within the A/D converter 10. A calibration process consists of performing a first calibration cycle for m iterations, and then performing a second calibration cycle for m iterations, and comparing discharge times from the first and second cycles in order to calculate a calibration factor α.

The calibration factor α is calculated according to the following formula:

$$\alpha = k1 \cdot \left(1 - \frac{|\lambda|}{m} \cdot \frac{TC2_1 - TC2_2}{TCAL1 - TCAL2}\right)$$

where:
λ=ideal ratio of primary discharge current to secondary discharge current
$TC2_1$=discharge value from the m first calibration cycles
$TC2_2$=discharge value from the m second calibration cycles
TCAL1=known calibration time for the first calibration cycles
TCAL2=known calibration time for the second calibration cycles
k1=a constant, if necessary, due to scaling in implementation
m=the number or iterations that the first and second calibration cycles are performed in the calibration process.

The discharge values $TC2_1$, $TC2_2$, are determined by performing the first and second calibration cycles, respectively. TCAL1 and TCAL2 are known values.

The calibration process will be discussed with reference to FIGS. 2 and 5. Prior to calibration, the switch SW3 is opened, and remains open throughout calibration. The first calibration cycle is performed in step S120. A first discharge time TC2 is determined in step S120 for the current iteration of the first calibration cycle (the first calibration cycle is discussed in detail with reference to FIG. 6). Steps S110 and S120 are performed m times. After m first discharge times TC2 are determined, the first discharge value $\overline{TC2_1}$ is determined in step S125. The first discharge value $\overline{TC2_1}$ can be calculated as a sum of the m first discharge times TC2 from the m first calibration cycles, e.g., as a "cumulative" discharge time. The value m can be any positive integer, including one.

After the m first calibration cycles are completed, the A/D converter 10 switches to execution of m second calibration cycles. In step S130, a second calibration cycle is performed. In step S140, a second discharge time TC2 is determined for each second calibration cycle. After m iterations of steps S130 and S140, the m values of second discharge time TC2 are used to determine a second discharge value $\overline{TC2_2}$, in step S145. The second discharge value $\overline{TC2_2}$ may also be a cumulative discharge time for the $\overline{m}$ second calibration cycles.

In step S150, the calibration factor a is calculated using the formula:

$$\alpha = k1 \cdot \left(1 - \frac{|\lambda|}{m} \cdot \frac{TC2_1 - TC2_2}{TCAL1 - TCAL2}\right)$$

The first and second calibration cycles will now be discussed in detail with reference to FIGS. 2 and 5–7.

An iteration of the first calibration cycle, corresponding to step S110 in FIG. 5, is illustrated in FIG. 6. The first calibration cycle begins in state 8, with the switches SW1, SW2 and SW3 open. The switches SW1 and SW2 remain open for a time TC3. In step S90, the switch SW1 is closed for the first known calibration time TCAL1. The first known calibration time TCAL1 can be, for example, 1000 counts. As shown in FIG. 6, the application of the secondary discharge current –VREF/R1 causes the integration capacitor C voltage to cross zero during TCAL1. The time TCAL1 corresponds to states 9 and 7. It is not necessary to measure a zero crossing at state 7.

The switch SW1 is opened in step S95, disconnecting the secondary discharge current from the integrator 12 for a time TC1. This corresponds to state 1 in FIG. 2.

In step S200, the switch SW2 is closed, and the primary discharge current is applied to the inverting input 16. The primary discharge current of N·VREF/R2 then discharges the integration capacitor C through ground, until the signal X crosses zero. The zero crossing (state 3) is detected in step S300. The zero crossing is illustrated in FIG. 7. In step S400, the switch 1 remains closed for a known time to accumulate a nonzero charge on the integration capacitor C, corresponding to state 4 in FIG. 2. In step S80, the control logic 30 opens the switch SW2, restoring the A/D converter 10 to state 8. The processor of the A/D converter 10 determines TC2 as the time required for the capacitor C voltage to cross zero after applying the primary discharge current, plus the known time in step S400. TC2 is the discharge time for the first calibration cycle.

After the first iteration of the first calibration cycle is complete, the A/D converter 10 performs the first calibration cycle repeatedly for m cycles. The m first discharge times TC2 from the m first calibration cycles are used to determine the cumulative, first discharge value $\overline{TC2_1}$ in step S125 (FIG. 5).

After performing m first calibration cycles, m second calibration cycles are performed. The second calibration cycles are also performed using the steps illustrated by FIG. 6, each second calibration cycle illustrated by FIG. 6 corresponding to an iteration of step S130 in FIG. 5. From each of the m second calibration cycles, a second discharge time TC2 is determined (step S140 of FIG. 5). From the m second discharge times $\underline{TC2}$, the cumulative, second discharge value $\overline{TC2_2}$ for the m second calibration cycles is determined.

As shown in FIG. 8, the m second calibration cycles are performed using a calibration time TCAL2 that is shorter than TCAL1.

The first and second discharge values $\overline{TC2_1}$, $\overline{TC2_2}$ are used to calculate the calibration factor α as discussed above with reference to FIG. 5. When the calibration process has been completed, and the calibration factor α calculated, the A/D converter 10 reverts to the conversion mode. In the conversion mode, the A/D) converter 10 utilizes the calibration factor α for calculation of the correction time Δ.

According to the present invention, the first and second discharge values are a function of the ratio of the primary discharge current to the secondary discharge current. This ratio dictates the zero crossing times that result from the applications of the primary discharge current, which are used to determine the discharge values. The calibration factor can therefore be determined based upon the actual ratio of the primary discharge current to the secondary discharge current, and on the known calibration times. This feature eliminates the need for an external reference during calibration. In addition, it is not necessary to calculate the actual values of the primary and secondary discharge currents, or of the corresponding voltages –VREF and N·VREF, because only the ratio between the values is required to calculate the calibration ratio.

As a further advantage, the small reference voltage –VREF and the large reference voltage N·VREF may be the references used during conversion operations of the A/D converter. Therefore, the calibration result accurately reflects the errors arising during conversion operations of the A/D converter.

While the present invention is described with reference to exemplary embodiments, it will be understood that many modifications will be readily apparent to those skilled in the art, and the present disclosure is intended to cover variations thereof.

What is claimed is:

1. A method of calculating a calibration factor for an analog-to-digital converter, comprising:
    performing at least one iteration of a first calibration cycle, comprising:
       applying a secondary discharge current to an integrator for a first calibration time; and
       applying a primary discharge current to the integrator for a first discharge time;
    determining a first discharge value from the at least one iteration of the first calibration cycle;
    performing at least one iteration of a second calibration cycle, comprising:
       applying the secondary discharge current to the integrator for a second calibration time; and
       applying the primary discharge current to the integrator for a second discharge time;
    determining a second discharge value from the at least one iteration of the second calibration cycle; and
    calculating the calibration factor using the first and second discharge values and the first and second calibration times.

2. The method of claim 1, wherein the at least one iteration of the first calibration cycle comprises m first calibration cycles, wherein m is a positive integer.

3. The method of claim 2, wherein the step of determining the first discharge value comprises:
   determining a first discharge time from each of the m first calibration cycles; and
   determining the first discharge value from the m first discharge times.

4. The method of claim 3, wherein the at least one iteration of the second calibration cycle comprises m second calibration cycles.

5. The method of claim 4, wherein the step of determining the second discharge value comprises:
   determining a second discharge time from each of the m second calibration cycles; and
   determining the second discharge value from the m second discharge times.

6. The method of claim 3, wherein the step of determining the first discharge value comprises:
   adding the first discharge times.

7. The method of claim 3, wherein the step of determining a first discharge time from each of the m first calibration cycles comprises:
   detecting a zero crossing of an output signal while the primary discharge current is applied.

8. The method of claim 1, wherein the primary discharge current has a polarity opposite to that of the secondary discharge current.

9. A method of calibrating an analog-to-digital converter, comprising: performing a calibration process, comprising:
   performing at least one iteration of a first calibration cycle;
   determining a first discharge value;
   performing at least one iteration of a second calibration cycle;
   determining a second discharge value; and
   calculating a calibration factor; and
   performing a conversion process, comprising:
   calculating a correction time as a function of the calibration factor;
   applying an input current to an integrator;
   applying a primary discharge current to the integrator;
   detecting a first zero crossing;
   applying a secondary discharge current to the integrator; and
   detecting a second zero crossing, wherein the time that the secondary discharge current is applied to the integrator is a function of the correction time.

10. The method of claim 9, wherein the step of applying a secondary discharge current comprises the step of:
   continuing to apply the secondary discharge current to the integrator after the second zero crossing for a known period of time plus the correction time.

11. The method of claim 9, wherein the at least one iteration of the first calibration cycle comprises m first calibration cycles, wherein m is a positive integer, and wherein the step of determining the first discharge value comprises:
   determining a first discharge time from each of the m first calibration cycles; and
   determining the first discharge value from the m first discharge times.

12. The method of claim 11, wherein the step of determining a first discharge time from each of the m first calibration cycles comprises:
   detecting a zero crossing of an output signal while the primary discharge current is applied.

13. The method of claim 9, wherein each iteration of the first calibration cycle comprises:
   applying the secondary discharge current to an integrator for a first calibration time; and
   applying the primary discharge current to the integrator for a first discharge time.

14. The method of claim 13, wherein each iteration of the second calibration cycle comprises:
   applying the secondary discharge current to an integrator for a second calibration time; and
   applying the primary discharge current to the integrator for a second discharge time.

15. A method of calculating a calibration factor for an analog-to-digital converter, comprising:
   performing at least one iteration of a first calibration cycle, comprising:
   applying a first reference voltage to supply a first current to an integrator for a first calibration time; and
   applying a second reference voltage to supply a second current to the integrator for a first discharge time;
   performing at least one iteration of a second calibration cycle; and
   calculating the calibration factor.

16. The method of claim 15, wherein the step of performing at least one iteration of a second calibration cycle comprises:
   applying the first reference voltage to supply the first current to an integrator for a second calibration time; and
   applying the second reference voltage to supply the second current to the integrator for a second discharge time.

17. The method of claim 16, comprising:
   determining a first discharge value from the at least one iteration of the first calibration cycle; and
   determining a second discharge value from the at least one iteration of the second calibration cycle, wherein the calibration factor is calculated using the first and second discharge values.

18. The method of claim 17, wherein the step of determining a first discharge time from the first calibration cycle comprises:
   detecting a zero crossing of an output signal while the second current is applied.

19. The method of claim 15, wherein the first reference voltage has a polarity opposite to that of the second reference voltage.

20. The method of claim 15, wherein the at least one iteration of the first calibration cycle comprises m first calibration cycles, wherein m is a positive integer.

* * * * *